United States Patent
Liang et al.

(10) Patent No.: US 7,256,515 B2
(45) Date of Patent: Aug. 14, 2007

(54) POWER SUPPLY SYSTEM WITH HIGH COOLING CAPABILITY

(75) Inventors: Yuan-Chen Liang, Tao Yuan Shien (TW); Yu-Shin Liao, Taipei (TW); Chao-Jung Chen, Taipei (TW)

(73) Assignee: Quanta Computer, Inc., Tao Yuan Shien (TW)

( * ) Notice: Subject to any disclaimer, the term of this patent is extended or adjusted under 35 U.S.C. 154(b) by 253 days.

(21) Appl. No.: 11/030,183

(22) Filed: Jan. 7, 2005

(65) Prior Publication Data

US 2006/0152876 A1 Jul. 13, 2006

(51) Int. Cl.
*H02J 1/10* (2006.01)
(52) U.S. Cl. .......................... 307/43; 361/687; 361/695
(58) Field of Classification Search ................. 307/45, 307/65, 43; 361/687, 688, 695
See application file for complete search history.

(56) References Cited

U.S. PATENT DOCUMENTS

| | | | |
|---|---|---|---|
| 5,726,506 A * | 3/1998 | Wood ........................ | 307/147 |
| 6,653,748 B2 * | 11/2003 | Buchanan ..................... | 307/51 |
| 6,829,141 B2 * | 12/2004 | Garnett et al. .............. | 361/687 |
| 2004/0228087 A1 * | 11/2004 | Coglitore .................... | 361/687 |
| 2005/0280990 A1 * | 12/2005 | Goodenough et al. ...... | 361/695 |
| 2006/0176648 A1 * | 8/2006 | Inoue et al. ................ | 361/600 |

* cited by examiner

*Primary Examiner*—Michael Sherry
*Assistant Examiner*—Daniel Cavallari
(74) *Attorney, Agent, or Firm*—Rabin & Berdo, PC

(57) ABSTRACT

A power supply system for supplying power to a system load is described. The power supply system includes a plurality of power supply modules. Each power supply module includes a power-generating module, a unidirectional device, and a fan. When the power-generating module is in normal operation, the power generated by the power-generating module is sent in one direction to the system load through the unidirectional device. When the power-generating module fails, the fan is powered from a terminal connected to the system load.

15 Claims, 2 Drawing Sheets

POWER SUPPLY SYSTEM WITH HIGH COOLING CAPABILITY

BACKGROUND

1. Field of Invention

The present invention relates to a power supply system. More particularly, the present invention relates to a power supply system having greater cooling ability.

2. Description of Related Art

An electronic system usually has a power supply for supplying power to the electronic system. Because the speed and complexity of electronic devices are increasing rapidly, the power consumed by electronic devices is getting higher and higher. Due to the large power consumption, heat generated by electronic devices has become a main problem for the stability and the life span of an electronic system. If an electronic device is working under an overly high temperature, it may suffer from the heat and may result in device failure. The life span may also be reduced.

Therefore, an electronic system that generates a large amount of heat usually uses fans to dissipate the heat. The fans can generate an air stream to carry the heat out of the electronic system and thus cool down the whole system. A larger electronic system, such as a file server, usually uses more than one power supply. A fan is usually powered by its corresponding power supply. If the power supply fails, the fan will not function. Then other fans have to increase their speed and performance to compensate for the loss of cooling capability. Increasing the rotation speed of a fan will cause large acoustic noise. Furthermore, speeding up a fan may reduce the life span of it. Therefore, there is a great need for having a new power supply system that can keep the fans operating even if one of the power supply modules fails.

SUMMARY

It is therefore an objective of the present invention to provide a power supply system for supplying power to a system load, where when a power-generating module fails, the fan associated with the power-generating module can still keep operating.

It is another objective of the present invention to provide a power supply system for supplying power to a system load, where the fan of a power supply module has two power sources.

It is yet another objective of the present invention to provide a method for cooling a system load, where the cooling for the system load is not interrupted or lost due to the failures of one or more power supply modules.

In accordance with the foregoing and other objectives of the present invention, a power supply system for supplying power to a system load is described. The power supply system includes a plurality of power supply modules. Each power supply module includes a power-generating module, a unidirectional device, and a fan. The power-generating module is used for generating power to supply to the system load. The unidirectional device is connected to the power-generating module at a first terminal and connected to the system load at a second terminal. The fan is used for providing an air stream to dissipate the heat generated by the system load. The fan is connected to the second terminal of the unidirectional device. The fan and the unidirectional device constitute a fan system for cooling the system load.

When the power-generating module is in normal operation, the power generated by the power-generating module is sent in one direction to the system load through the unidirectional device. When the power-generating module fails, the fan is powered from the second terminal connected to the system load. Each second terminal of the power supply modules is coupled with one another to supply power to the system load.

The unidirectional device is, for example, an ORing diode or an ORing FET. The power supply system can be used in a blade server.

In accordance with the foregoing and other objectives of the present invention, a method for cooling a system load is also provided. The method includes the following steps. First, outputs of a plurality of power supply modules are coupled with one another to supply power to the system load. Each power supply module comprises a power-generating module and a fan. Then, for one power supply module, a unidirectional device is used as an output stage. The unidirectional device receives power from the power-generating module and supplies power to the system load. Next, the output of the unidirectional device is connected to the fan of the power supply module.

The invention has at least the following advantages and each embodiment may present one or more advantages. In one embodiment of the invention, when a power-generating module fails, the fan associated with the power-generating module can still keep operating. In one embodiment of the invention, the fan of a power supply module has two power sources. In one embodiment of the invention, the cooling for the system load is not interrupted or lost due to the failures of one or more power supply modules.

It is to be understood that both the foregoing general description and the following detailed description are by examples and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
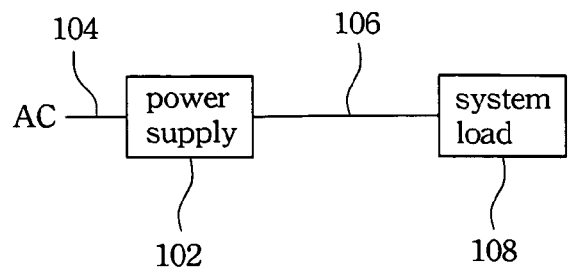
FIG. 1 is a block diagram illustrating a power supply used for a system load according to the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a block diagram illustrating a power supply used for a system load according to the invention. With reference to FIG. 1, the power supply 102 receives an AC power signal 104 and converts the AC power signal 104 into a suitable DC power signal 106. The DC power signal 106 is sent to the system load 108 to keep the system operating. Usually, the power supply 102 is associated with a fan. The fan is used to dissipate the heat generated by the system load 108 or the heat generated by the power supply 102.

Figure 2:
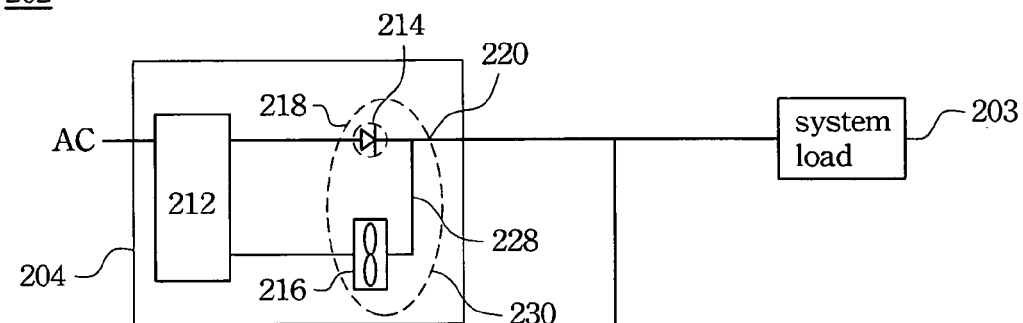
FIG. 2 is a detailed block diagram illustrating an embodiment of the power supply system according to the invention.
Figure 2:
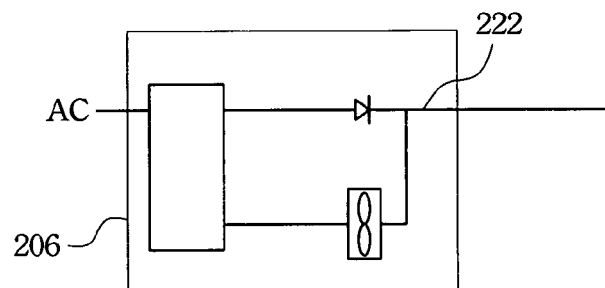
Figure 2:
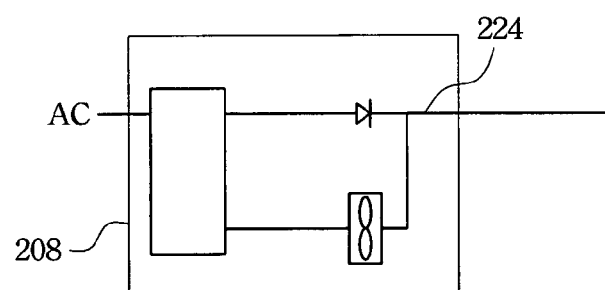
Figure 2:
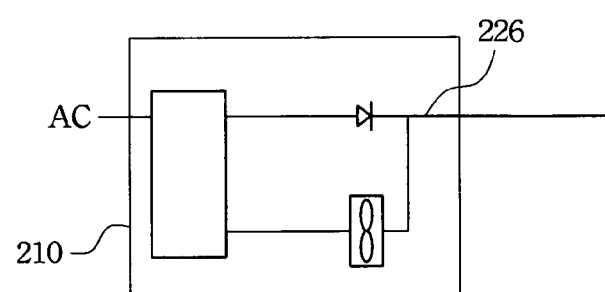

FIG. 2 is a detailed block diagram illustrating an embodiment of the power supply system according to the invention. With reference to FIG. 2, a power supply system 202 for supplying power to a system load 203 is illustrated. The power supply system 202 includes a plurality of power supply modules (204, 206, 208, 210). Taking the power supply module 204 as an example, the power supply module 204 includes a power-generating module 212, a unidirectional conducting device 214, and a fan 216. The power-generating module 212 generates power to supply to the system load 203. The unidirectional device 214 is connected to the power-generating module 212 at a first terminal 218 and connected to the system load 203 at a second terminal 220. The fan 216 is used to provide an air stream to dissipate the heat generated by the system load 203 or by the power-generating module 212. The fan 216 is connected to the power-generating module 212 and the second terminal 220 of the unidirectional device 214. The fan 216 and the unidirectional device 214 constitute a fan system 230 for cooling the system load 203.

When the power-generating module 212 is in normal operation, the power generated by the power-generating module 212 is sent in one direction to the system load 203 through the unidirectional device 214. When the power-generating module 212 fails, the fan 216 is powered from the second terminal 220 connected to the system load 203.

As shown in FIG. 2, in this embodiment, each second terminal (220, 222, 224, 226) of the power supply modules (204, 206, 208, 210) is coupled with one another to supply power to the system load 203. The unidirectional device 214 is, for example, an ORing diode or an ORing FET. The unidirectional device 214 can allow the power generated by the power-generating module 212 to pass in one direction and then supply the power to the system load 203. Because the outputs (the second terminals 220, 222, 224, 226) of a plurality of power supply modules (204, 206, 208, 210) are coupled with one another, they cooperate to supply power to the system load 203.

If one of the power supply modules (204, 206, 208, 210) fails, other power supply modules can still supply power to the system load 203. The power supplied to the system load 203 is not interrupted or lost at any time. Upon the failure of one of the power supply modules, the system load 203 continues operating without having to shutdown.

For example, if the power supply module 204 fails, the system load 203 is powered by the power supply modules (206, 208, 210) through the second terminals (222, 224, 226). The fan 216 can be powered via the second terminal 220 and the connection line 228. The unidirectional device 214 is used to block the power generated by other power supply modules (206, 208, 210) and thus keeps the power-generating module 212 safe.

The fan 216 can be powered by the power-generating module 212 or by other power supply modules (206, 208, 210). For example, if the power-generating module 212 is in normal operation mode, the fan 216 is powered by the power-generating module 212. If the power-generating module 212 fails, the fan 216 can be powered by other power supply modules (206, 208, 210). Therefore, the fan 216 still functions even if its associated power-generating module 212 fails. The system load 203 and the power-generating module 212 will not have overheating problems.

Besides the power supply module 204, other power supply modules (206, 208, 210) can use a circuit similar to the power supply module 204 mentioned above. By doing so, even if more than one power supply module fails, other functioning power supply modules can still supply power to the system load 203 and, at the same time, keep the fans of the failed power supply module in operation. As long as one power-generating module is functioning, all the fans in this power supply system 202 can still work.

Figure 3:
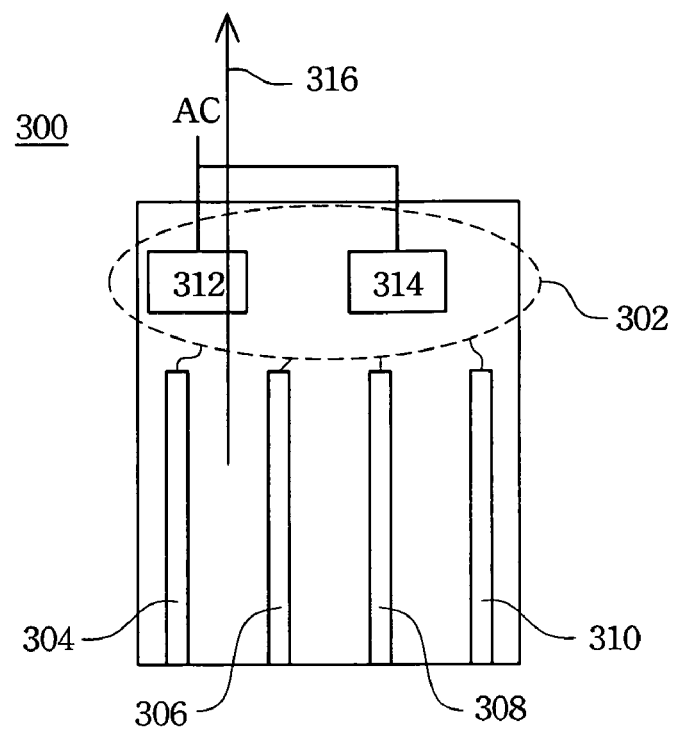
FIG. 3 is a top view of a blade server.

FIG. 3 is a top view of a blade server. With reference to FIG. 3, a power supply system 302 is installed in the rear portion of the blade server 300. The power supply system 302 receives AC power and converts the AC power into DC power. The DC power is supplied to the blades (304, 306, 308, 310) installed in the front portion of the blade server 300. In this embodiment, the power supply system 302 has four power supply modules. Two (312, 314) of the four power supply modules are shown in FIG. 3. The other two power supply modules are placed below the power supply modules (312, 314) and thus are not shown in FIG. 3. In this embodiment, each power supply module has a fan. The fans provide an air stream flowing in the direction 316, so that the blades (304, 306, 308, 310) can be cooled.

Because a large system like a blade server usually needs more than one power supply module and more than one fan to dissipate the heat generated by the operation, the invention can be easily applied in a large system. Power supply modules usually have shorter life spans than other devices in the blade server. Therefore, using the power supply system illustrated in FIG. 2 can supply power to sustain the operation of the fan of a failed power supply module. Because the probability of failures of all the power supply modules in one system is very low, this invention provides a practical way to prevent the system load from overheating.

A method for cooling a system load is also provided. With reference to FIG. 2, the method includes the following steps. First, outputs (220, 222, 224, 226) of a plurality of power supply modules (204, 206, 208, 210) are coupled with one another to supply power to the system load 203. Each power supply module comprises a power-generating module and a fan. Then, for one power supply module (such as power supply module 204), a unidirectional device 214 is used as an output stage. The unidirectional device 214 receives power from a power-generating module 212 and supplies power to the system load 203. Next, the output of the unidirectional device 214 is connected to the fan 216 of the power supply module 204.

Figure 4:
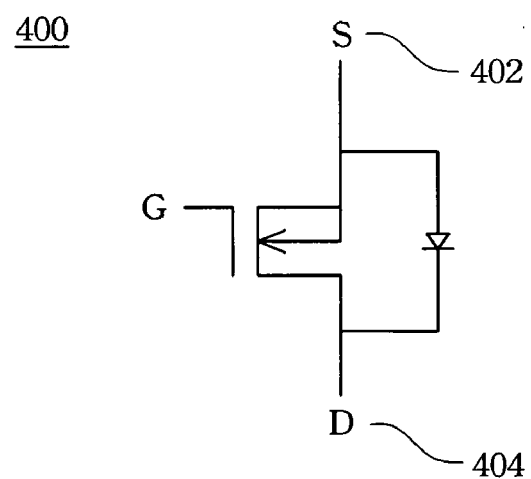
FIG. 4 is a circuit diagram illustrating an example of the unidirectional device.

FIG. 4 is a diagram illustrating an example of the unidirectional device, an ORing FET (400). With reference to both FIG. 2 and FIG. 4, the Source 402 can be connected to the first terminal 218 and the Drain 404 can be connected to the second terminal 220. Thus, the ORing FET serves as the unidirectional device 214 for the power supply module 204.

When the power-generating module 212 is in normal operation, the fan 216 is powered by the power-generating module 212. When the power-generating module 212 fails, the fan 216 is powered by the output of the unidirectional device 214 connected to the system load 203.

The invention has at least the following advantages and each embodiment may present one or more advantages. In one embodiment of the invention, when a power-generating module fails, the fan associated with the power-generating module can still keep operating. In one embodiment of the invention, the fan of a power supply module has two power sources. In one embodiment of the invention, the cooling for the system load is not interrupted or lost due to the failures of one or more power supply modules.

Although the present invention has been described in considerable detail with reference to certain preferred embodiments thereof, other embodiments are possible. Therefore, the spirit and scope of the appended claims should not be limited to the description of the preferred embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A power supply system for supplying power to a system load, the power supply system comprising:
    a plurality of power supply modules, wherein each power supply module comprises:
        a power-generating module for generating power to supply to the system load;
        a unidirectional device connected to the power-generating module at a first terminal and connected to the system load at a second terminal; and
        a fan for providing an air stream to dissipate the heat generated by the system load, the fan being connected to the second terminal of the unidirectional device;
        wherein (i) when the power-generating module is in normal operation, the power generated by the power-generating module is sent in one direction to the system load through the unidirectional device, and (ii) when the power-generating module fails, the fan is powered from the second terminal connected to the system load;
    wherein each second terminal of the power supply modules is coupled with one another to supply power to the system load.

2. The power supply system of claim 1, wherein the unidirectional device is an ORing diode.

3. The power supply system of claim 1, wherein the unidirectional device is an ORing FET.

4. The power supply system of claim 1, wherein the power supply system is used in a blade server.

5. The power supply system of claim 1, wherein when the power-generating module is in normal operation, the fan is powered by the power-generating module.

6. A method for cooling a system load, the method comprising:
    coupling outputs of a plurality of power supply modules with one another to supply power to the system load, wherein each power supply module comprises a power-generating module and a fan.
    for one power supply module, using a unidirectional device as an output stage, the unidirectional device receiving power from a power-generating module and supplying power to the system load; and
    connecting the output of the unidirectional device to the fan of the power supply module;
    wherein when the power-generating module is in normal operation, the fan is powered by the power-generating module, and when the power-generating module fails, the fan is powered by the output of the unidirectional device connected to the system load.

7. The method of claim 6, wherein the unidirectional device is an ORing diode.

8. The method of claim 6, wherein the unidirectional device is an ORing FET.

9. The method of claim 6, wherein the method is used for a blade server.

10. A fan system for cooling a system load, the fan system comprising:
    a unidirectional device being connected to a power-generating module at a first terminal and connected to the system load at a second terminal; and
    a fan for providing an air stream to dissipate the heat generated by the system load, the fan being connected to the second terminal of the unidirectional device;
    wherein (i) when the power-generating module is in normal operation, the power generated by the power-generating module is sent in one direction to the system load through the unidirectional device, and (ii) when the power-generating module fails, the fan is powered by the second terminal connected to the system load.

11. The fan system of claim 10, wherein a plurality of fan systems is used to cool the system load and each second terminal of the fan systems is coupled with one another.

12. The fan system of claim 10, wherein the unidirectional device is an ORing diode.

13. The fan system of claim 10, wherein the unidirectional device is an ORing FET.

14. The fan system of claim 10, wherein the fan system is used in a blade server.

15. The fan system of claim 10, wherein when the power-generating module is in normal operation, the fan is powered by the power-generating module.

* * * * *